(12) United States Patent
Chen et al.

(10) Patent No.: US 7,655,984 B2
(45) Date of Patent: Feb. 2, 2010

(54) SEMICONDUCTOR DEVICE WITH DISCONTINUOUS CESL STRUCTURE

(75) Inventors: Chien-Liang Chen, Hsin-Chu (TW); Wen-Chih Yang, Hsin-Chu (TW); Chii-Horng Li, Jhu-Bei (TW); Harry Chuang, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 11/811,693

(22) Filed: Jun. 12, 2007

(65) Prior Publication Data
US 2008/0308873 A1   Dec. 18, 2008

(51) Int. Cl.
*H01L 29/78* (2006.01)
(52) U.S. Cl. .............. 257/369; 257/371; 257/374; 257/900; 257/E27.062; 257/E27.067; 257/E29.128
(58) Field of Classification Search .......... 257/288, 257/338, 369, 371, 374, E27.062, E27.067, 257/900, E29.128
See application file for complete search history.

(56) References Cited

U.S. PATENT DOCUMENTS

| 7,416,973 | B2* | 8/2008 | Peters et al. | 438/627 |
| 2006/0189053 | A1* | 8/2006 | Wang et al. | 438/197 |
| 2007/0077765 | A1* | 4/2007 | Prince et al. | 438/694 |
| 2007/0099360 | A1* | 5/2007 | Lee et al. | 438/197 |
| 2007/0287240 | A1* | 12/2007 | Chen et al. | 438/197 |
| 2008/0185659 | A1* | 8/2008 | Ke et al. | 257/371 |

* cited by examiner

*Primary Examiner*—Minh-Loan T Tran
(74) *Attorney, Agent, or Firm*—Slater & Matsil, L.L.P.

(57) ABSTRACT

A semiconductor device using a CESL (contact etch stop layer) to induce strain in, for example, a CMOS transistor channel, and a method for fabricating such a device. A stress-producing CESL, tensile in an n-channel device and compressive in a p-channel device, is formed over the device gate structure as a discontinuous layer. This may be done, for example, by depositing an appropriate CESL, then forming an ILD layer, and simultaneously reducing the ILD layer and the CESL to a desired level. The discontinuity preferably exposes the gate electrode, or the metal contact region formed on it, if present. The upper boundary of the CESL may be further reduced, however, to position it below the upper boundary of the gate electrode.

16 Claims, 13 Drawing Sheets

SEMICONDUCTOR DEVICE WITH DISCONTINUOUS CESL STRUCTURE

TECHNICAL FIELD

The present invention relates generally to the field of semiconductor devices, and more particularly to a semiconductor device that advantageously induces channel stress in a transistor or similar device using a discontinuous CESL (contact etch stop layer), and a method for fabricating such a device.

BACKGROUND

Semiconductor devices are widely used in the manufacture of electronic appliances such as personal computers, mobile phones, and digital music players. Semiconductor devices are typically installed as the familiar chip, and mounted on a printed wire board in the appliance. The printed wire board has conductors that are used to provide electrical power to the chip, and to carry the electrical signals between the chips in the appliance and the various input/output devices such as keyboards, displays, and network connections. Electronic appliances like these are very popular. One of the reasons for their popularity is their small size. Many are portable, and even those that are not typically are designed so as not to take up too much room on a shelf or desktop. There is, in fact, continuing market pressure to make these devices even smaller, while at the same time enhancing their capabilities. This poses many challenges for designers.

A semiconductor chip, generally speaking, is a small piece of treated silicon or some other semiconductor material that is encapsulated in the familiar plastic enclosure. A semiconductor material is one that conducts electricity only under certain circumstances, such as the application of a small electrical charge. The small piece of semiconductor material in a chip has fabricated on its surface thousands, or perhaps millions of tiny electrical components that can take advantage of this property to manipulate electrical signals in a way that makes operation of the electronic appliance possible. These electrical components are interconnected to form integrated circuits, and there is provided through bonding wires, leads, or conductive bumps the external connection referred to above.

Figure 1:
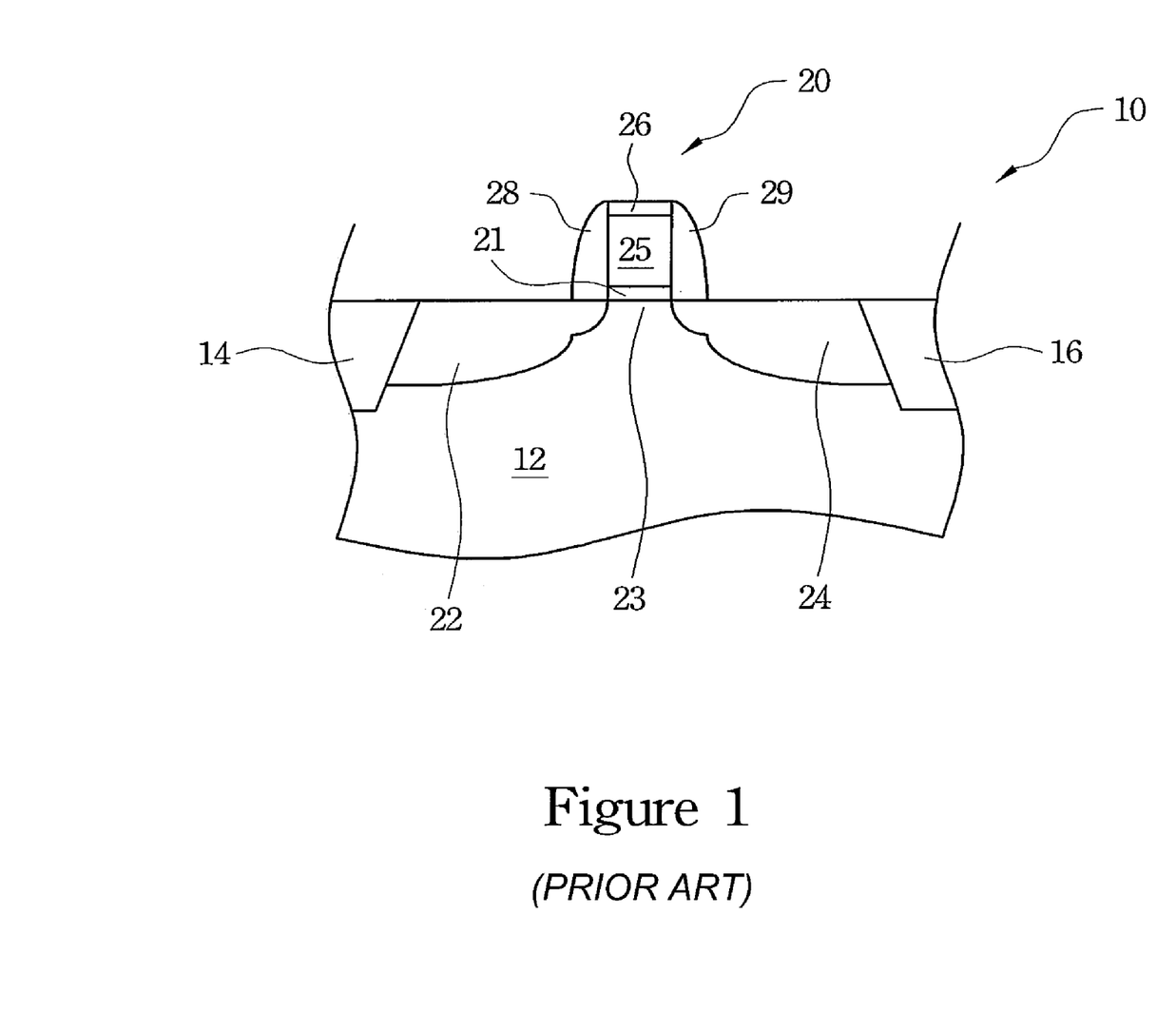
FIG. 1 is a side (elevation) view illustrating in cross-section a typical transistor.

One such tiny electrical component is a transistor. A transistor is basically a small, solid-state switch. One such device is shown in FIG. 1. FIG. 1 is a side (elevation) view illustrating in cross-section a typical transistor 10. Note that, as with all of the Figures herein, FIG. 1 is not necessarily drawn to scale. Transistor 10 includes a gate structure 20, which in operation is used to control the flow of electricity through the channel region 23 beneath it. The gate structure 20 includes a gate electrode 25, which is separated from the substrate 12 by a dielectric layer 21. The substrate 12, as mentioned above, is often formed of silicon or another suitable material. The dielectric layer 21 may be silicon dioxide that has been formed on the surface of the substrate 12. Spacers 28 and 29 are disposed on either side of the gate structure 20, and may be made, for example, of silicon nitride. A contact region 26 is formed at the top of gate electrode 25 to provide for a reliable external electrical connection. In this example, the gate electrode 25 is formed of a poly (polycrystalline silicon) material, and the contact region 26 of a metal such as copper. Other materials and configurations (not shown) may also be used.

In the example of FIG. 1, a source region 22 and a drain region 24 have been formed in the substrate 12, and together define channel region 23. As alluded to above, electrical current can be induced to flow through channel region 23 if an appropriate voltage is applied to the gate electrode 25. STI (shallow trench isolation) structures 14 and 16 help to prevent undesirable current leakage into other regions of substrate 12. Note that channel current may be considered to be carried by negative (n-type) or positive (p-type) charge carriers. The local nature of the substrate and of the source and drain regions determine which type of carrier will be exploited in a particular transistor. The nature of each region is determined by the type of ion implantation, or doping, used to form it.

Transistors such as transistor 10 illustrated in FIG. 1 are sometimes referred to as MOSFETs (metal-oxide semiconductor field effect transistors—even though poly instead of metal is now often used for the gate electrode). A MOSFET having an n-type or p-type source and drain regions are called, respectively, NMOS and PMOS semiconductor devices. It has been found that NMOS and PMOS devices may be used together to advantage as CMOS (complimentary metal oxide semiconductor) devices. An example is shown in FIG. 2.

Figure 2:
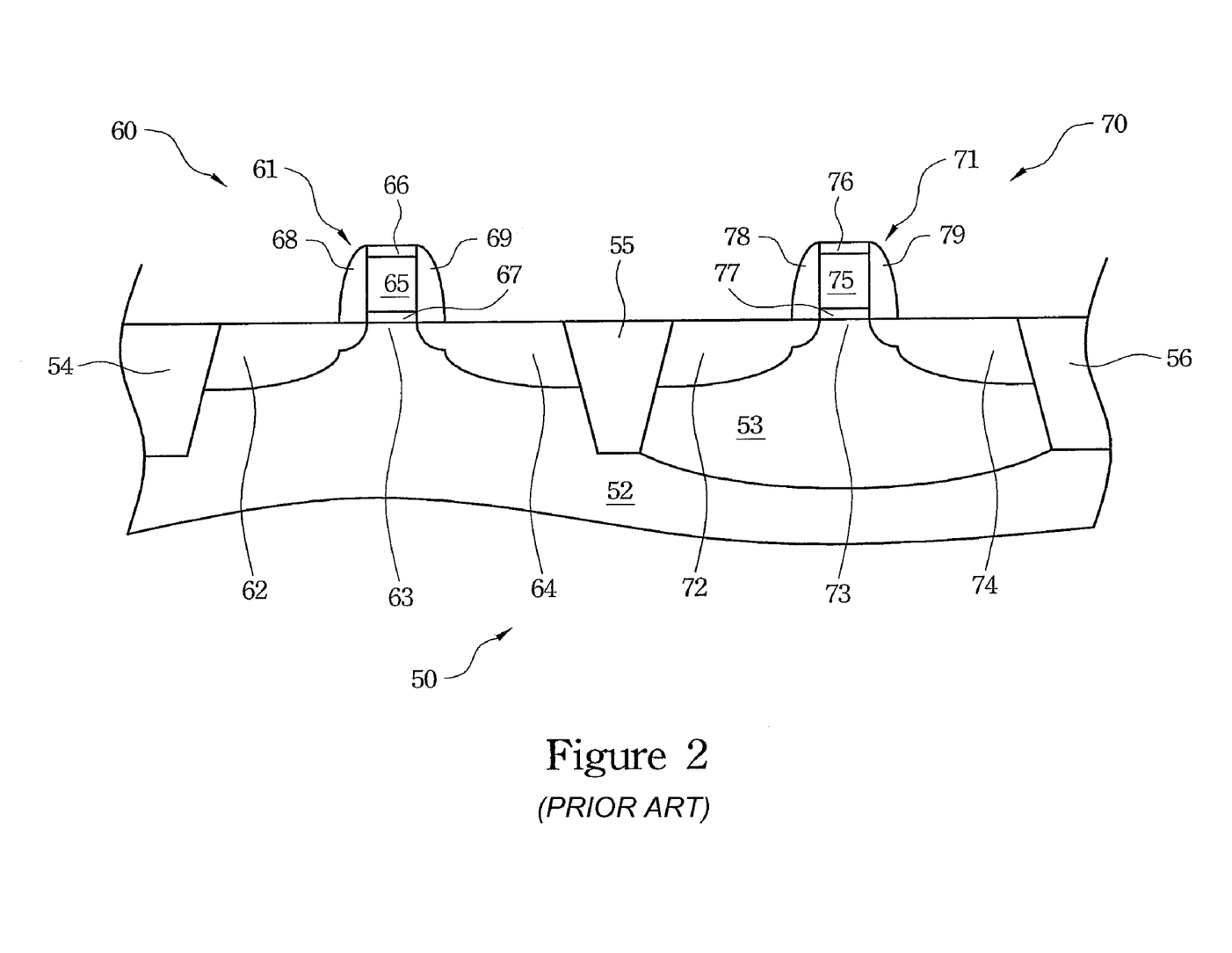
FIG. 2 is side view illustrating in cross-section a typical pair of transistors in a CMOS configuration.

FIG. 2 is side view illustrating in cross-section a typical pair of transistors in a CMOS configuration. CMOS semiconductor device 50 includes an NMOS device 60 and a PMOS device 70. In this example, substrate 52 is a p-type substrate. Since the PMOS device 70 requires an n-type substrate, an n-well 53 has been formed in p-type substrate 52 for this purpose. Gate structure 71 has been formed over the n-well 53. Gate structure 71 of PMOS device 70 includes a gate electrode 75 separated from n-well 53 of substrate 52 by a gate dielectric 77. Metal contact 76 is disposed on the poly gate electrode 75. A source 72 and drain 74 have been formed in n-well 53, defining a p-channel 73. Likewise, gate structure 61 has been formed over the p-substrate 52. Gate structure 61 of NMOS device 60 includes a gate electrode 65 separated from substrate 52 by a gate dielectric 67. Metal contact 66 is disposed on the poly gate electrode 65. A source 62 and drain 64 have been formed in substrate 52, defining an n-channel 63. NMOS device 60 and PMOS device 70 are separated by STI 55, and STIs 54 and 56 provide isolation from other devices (not shown) formed on the same substrate 52.

As might be apparent, efficient carrier mobility through the channels 23, 63, and 73 described above is very important. Achieving it, however, becomes more difficult as channel length, along with the dimensions of the various transistor components, are scaled-down to provide the smaller and more capable devices demanded by the market. One way to enhance carrier mobility is to induce a strain in the channel-region material. There are several ways to do this. One is to use as channel-region material a silicon layer on a silicon-germanium base. Another is to use appropriately formed STIs that provide a stress force to induce strain in the channel region. Still another method involves using a stress producing CESL (contact etch stop layer).

The CESL (not shown in FIGS. 1 and 2) is typically formed as a uniform layer over the transistors, such as NMOS device 60 and PMOS device 70, including their respective source and drain regions. The CESL may be formed so as to produce either a tensile or a compressive stress in the channel region. The different devices, however, require different stresses for carrier-mobility enhancement. An NMOS device, for example, benefits from a tensile stress CESL, while a PMOS device benefits from compressive stress. For this reason, fabrication processes have been developed that place a tensile CESL over each NMOS device and a compressive CESL over every PMOS device. Generally speaking, this is achieved by forming structures, for example of photoresist, that protect one or the other of the devices when the appropriate CESL is being formed or selectively removed from those areas where it is not needed. In this way, both NMOS and PMOS devices can benefit from CESL-produced stress.

Unfortunately, a disadvantage of existing methods of CESL formation is that the means for adjusting the channel stress are often limited to changing the overall thickness of the CESL or the pitch at which adjacent semiconductor devices are spaced. Control of channel stress is sometimes inhibited by other factors. Needed, then, is a way to fabricate a stress-inducing CESL for transistors and similar semiconductor devices that is capable of increasing the channel stress in a controllable fashion without the need for significantly-increased CESL thickness. The present invention provides just such a solution.

SUMMARY OF THE INVENTION

These and other problems are generally solved or circumvented, and technical advantages are generally achieved, by preferred embodiments of the present invention, which are directed to a semiconductor device having a discontinuous CESL to produce desirable stresses in a channel region.

In accordance with a preferred embodiment of the present invention, a method for fabricating a semiconductor device includes forming a dielectric layer on a semiconductor substrate, followed by a poly or metal layer, then forming from these layers a gate stack. Dielectric spacers may be added to each side of the gate stack, and a source region and a drain region formed in the substrate adjacent to the gate structure. A CESL (contact etch stop layer) is then formed. The formed CESL is then reduced, leaving a portion of the gate stack exposed. This may be achieved by covering the gate stack and CESL with a photoresist layer, and then etching the photoresist layer and the CESL until desired upper boundary extent has been reached.

In accordance with another preferred embodiment of the present invention, a semiconductor device comprises a gate structure formed on a substrate, the substrate having a source region and a drain region formed adjacent the gate structure. A discontinuous CESL is formed over the gate structure, preferably leaving at least a portion of the gate structure exposed.

An advantage of a preferred embodiment of the present invention is that a precision CESL may be formed in an efficient manner on a semiconductor device.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a MOSFET (metal oxide semiconductor field effect transistor) having a poly gate. The invention may also be applied, however, to other types of semiconductor devices as well. In addition, it is noted that while the descriptions below will focus on implementation of the invention in a semiconductor device having a single transistor, or pair of transistors, it is understood that this is for purposes of illustration only, and usually there will be a great many such devices fabricated at the same time. Other semiconductor devices may also be formed at the same time or in some of the same process operations used for applying the present invention, but unless noted they are not relevant to describing the invention.

Figure 3:
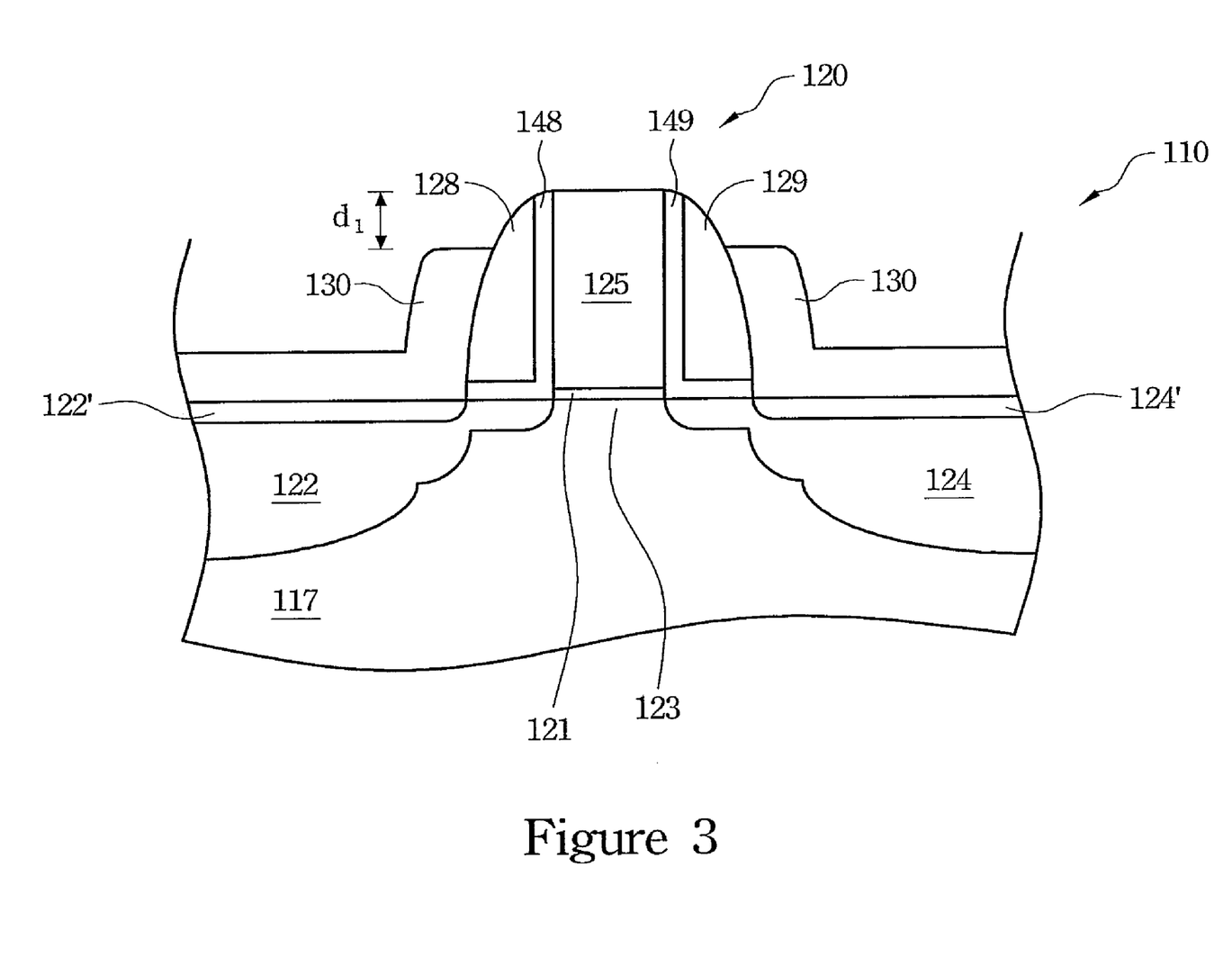
FIG. 3 is side view illustrating in cross-section an NMOS transistor according to an embodiment of the present invention.

FIG. 3 is side view illustrating in cross-section a semiconductor device 110, in this case an NMOS transistor, according to an embodiment of the present invention. In this embodiment, gate structure 120 includes a gate electrode 125. Spacers 128 and 129 are disposed on either side of the gate electrode 125. Oxide structures 148 and 149 physically separate the spacers 128 and 129 from the gate electrode 125, and in this embodiment from the substrate 117. Note that dielectric materials other than an oxide may be used for these structures in other embodiments and, given their location in the gate structure 120; they may simply be considered an inner layer of the spacers.

In the embodiment of FIG. 3, the gate electrode 125 of semiconductor device 110 is separated from substrate 117 by a gate dielectric layer 121, and is disposed over channel region 123. A channel region 123 is defined by source region 122 and drain region 124. Source region 122 includes silicide portion 122' and drain region 124 includes a silicide portion 124'. The silicide portions are formed, for example, by forming a layer of metal, such as nickel or a nickel alloy, over the region and performing a rapid thermal anneal.

In this embodiment, disposed over the source region 122 and the drain region 124, and adjacent to a portion of gate structure 120, is a discontinuous stress-producing CESL 130. CESL in this case produces a tensile stress, intended to induce a tensile strain in the channel region 123. As mentioned above, this effect tends to enhance carrier mobility in NMOS devices such as semiconductor device 110. The discontinuity in CESL 130 may be introduced in several ways, some of which are described below. The discontinuous CESL layer 130 in FIG. 3 is illustrated as symmetrical about the gate structure 120, although this is not necessarily the case. That is, the upper boundary of discontinuous CESL 130 may be higher or lower on the source-side of gate structure 120 as compared to the height of the discontinuous CESL 130 upper boundary on the drain-side.

Note that the height, or extent of the upper boundary of discontinuous CESL 130 may be described in relation to either the gate structure 120, itself or to the gate electrode 125. For example, in semiconductor device 110, the gate electrode height is substantially equal to the height of the gate structure 120, although this is not necessarily the case (see, for example, FIGS. 4 and 7). The height of the gate electrode will be considered the height of its upper boundary relative to the upper boundary of substrate 117, effectively including the thickness of the gate dielectric layer 121.

In this light, the upper extent of discontinuous CESL 130 in the embodiment of FIG. 3 is shown to be about 75%, but may be between 50% to 100% of the height of the gate electrode (and, in this case, of the gate structure as well). The difference in height between the upper extent of the CESL layer and the upper boundary of the gate electrode is represented in FIG. 3 by dimension $d_1$. In other embodiments, the discontinuity of the discontinuous CESL may be less or more, depending on the amount of stress, in the embodiment of FIG. 3 tensile stress, that is needed. In a preferred embodiment, the upper boundary of the CESL is at between 25% and 100% of the gate electrode height. That is, $d_1$ may be between 0% and 75% of the gate electrode's vertical dimension. Note that the use of this structure of the present invention therefore provides an important advantage in being able to more reliably control the stress level to that which is most useful in the device where it is applied.

Figure 4:
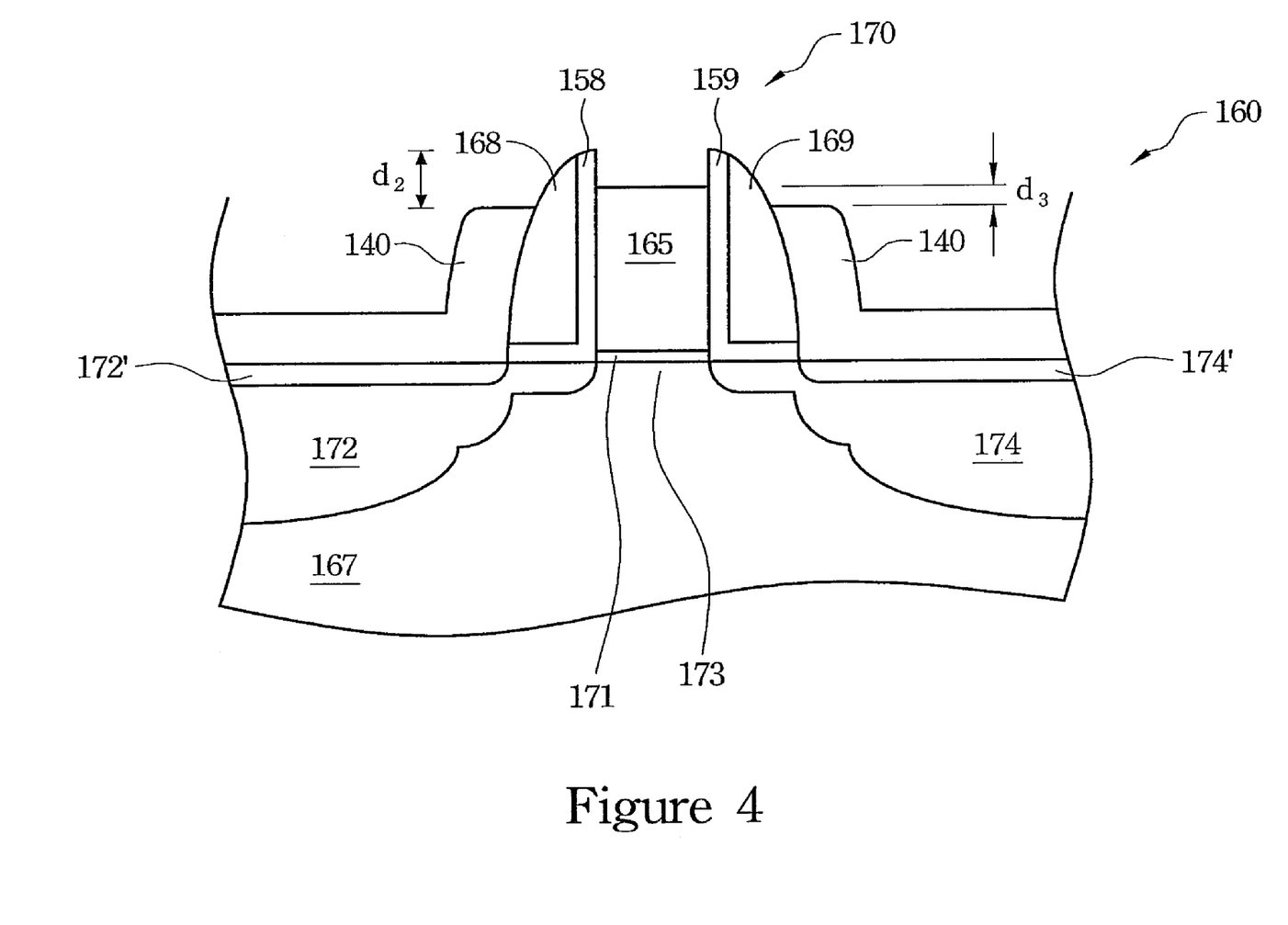
FIG. 4 is side view illustrating in cross-section a PMOS transistor according to another embodiment of the present invention.

FIG. 4 is side view illustrating in cross-section a semiconductor device 160, in this case a PMOS transistor, according to another embodiment of the present invention. As should be apparent, the visible structure of semiconductor device 160 is similar to that of semiconductor device 110 shown in FIG. 3. Similar or identical components will be numbered analogously, though identity is not implied thereby. In the embodiment of FIG. 4, gate structure 170 includes a gate electrode 165 that is separated from substrate 167 by a gate dielectric layer 171. Oxide structures 158 and 159 are disposed on either side of the gate electrode 165, and are disposed between it and the spacers 168 and 169.

Source region 172, including silicided portion 172', is formed in substrate 167 on one side of the gate electrode 165, and drain region 174, including silicided region 174', is formed on the other. Source region 172 and drain region 174 define a channel region 173 beneath the gate electrode 165. A discontinuous CESL 140 overlies the source region 172 and the drain region 174, and extends up the side of gate structure 170. As semiconductor device 160 is a PMOS transistor, the discontinuous CESL 140 is compressive stress producing, and is fabricated to produce a compressive strain in channel region 173. In this embodiment, the upper boundary of the discontinuous CESL 140 is shown in FIG. 4 to be about 80% of the height of the gate structure 170. The difference between the upper boundary of the CESL 140 and the upper boundary of gate structure 170 is represented in FIG. 4 by dimension $d_2$. In a preferred embodiment, $d_2$ is between 0% and 80% of the height of the gate structure 170.

As the height of the gate structure 170 and the gate electrode are not the same, note that the discontinuous CESL 140 may also be described as extending 95% of the height of the gate electrode 165, with the difference being represented in FIG. 4 by dimension $d_3$. In a preferred embodiment, d3 is between 0% and 95% of the height of the gate electrode 165. Again, the relative extent of these structures is determined at least in part by the amount of stress to be applied, which will vary from device to device. As mentioned above, the invention provides a more precise way of achieving the desired stress level.

Figure 7:
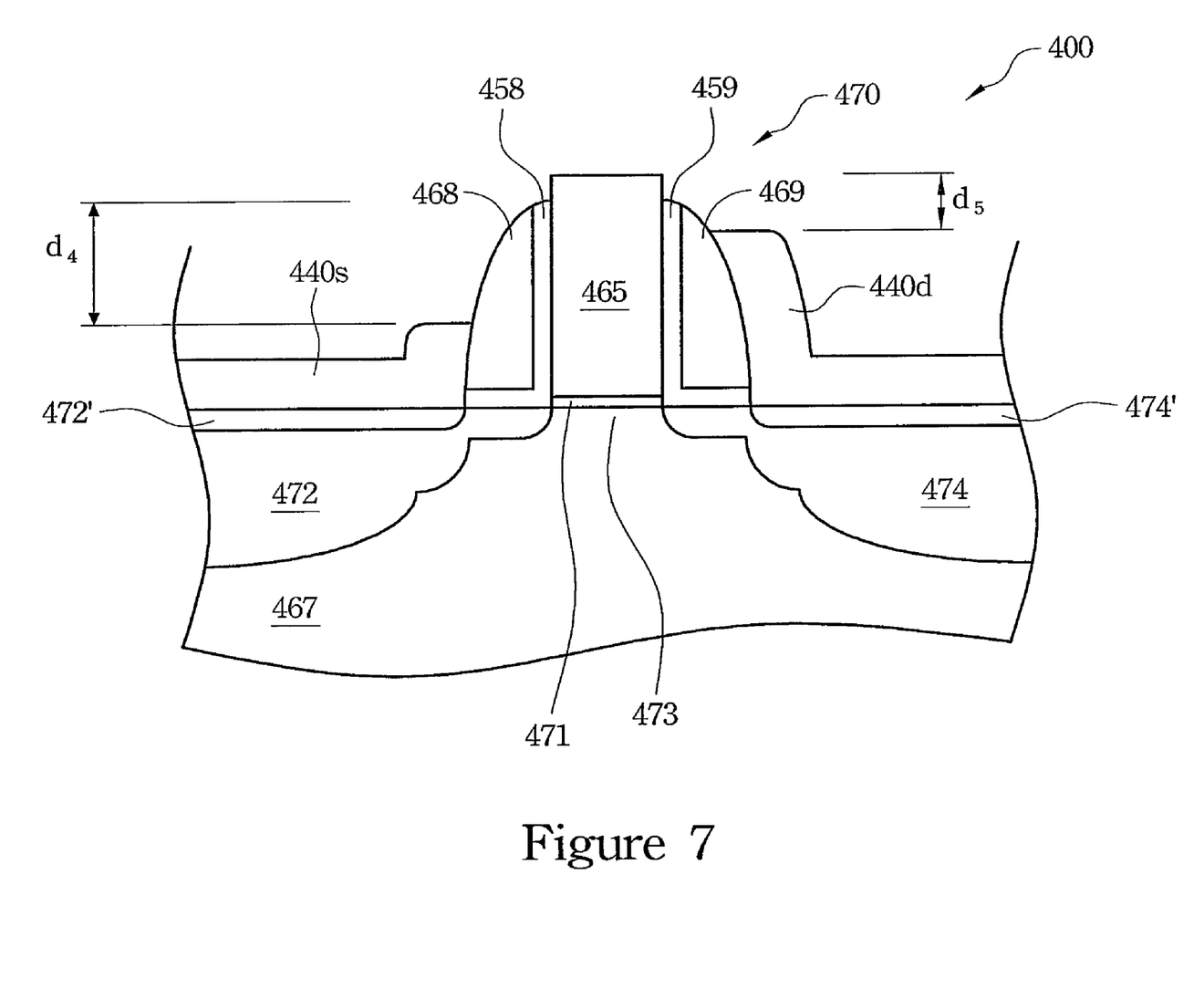
FIG. 7 is a side view illustrating in cross-section a semiconductor device according to another embodiment of the present invention.

The upper extent of the discontinuous CESL layer does not have to be the same on both sides, that is, on the source side and on the drain side. FIG. 7 is side view illustrating in cross-section a semiconductor device 400, according to another embodiment of the present invention. As should be apparent, the visible structure of semiconductor device 400 is similar to those described above, and similar or identical components will be numbered analogously, though identity is not implied thereby. In the embodiment of FIG. 7, gate structure 470 includes a gate electrode 465 that is separated from substrate 467 by a gate dielectric layer 471. Oxide structures 458 and 459 are disposed on either side of the gate electrode 465, and are disposed between it and the spacers 468 and 469. As can be seen in FIG. 7, in this embodiment, the gate electrode 465 extends above the rest of the gate structure 470.

Source region 472, including silicided portion 472', is formed in substrate 467 on one side of the gate electrode 465, and drain region 474, including silicided region 474', is formed on the other. Source region 472 and drain region 474 define a channel region 473 beneath the gate electrode 465. A discontinuous CESL overlies the source region 472 and the drain region 474, and extends up the side of gate structure 470. In this embodiment, the upper boundary of the discontinuous CESL 140 is asymmetrical. On the source side, CESL portion 440s as shown in FIG. 7 extends only about 30% of the height of the gate structure 470 (and, in this embodiment, of the gate electrode). On the drain side, CESL portion 440d is shown to extend about 85% of the height of the gate structure 470. In FIG. 7, the difference in height between the upper boundary of CESL portion 440s and the upper boundary gate structure 470 is referred to as $d_4$. The difference between the upper boundary of CESL portion 440d and the upper boundary of gate structure 470 is referred to as $d_5$. In a preferred embodiment, $d_4$ and $d_5$ are both between 0% and 95% of the gate-structure height although, as illustrated in FIG. 7, $d_4$ need not equal $d_5$.

Figure 5:
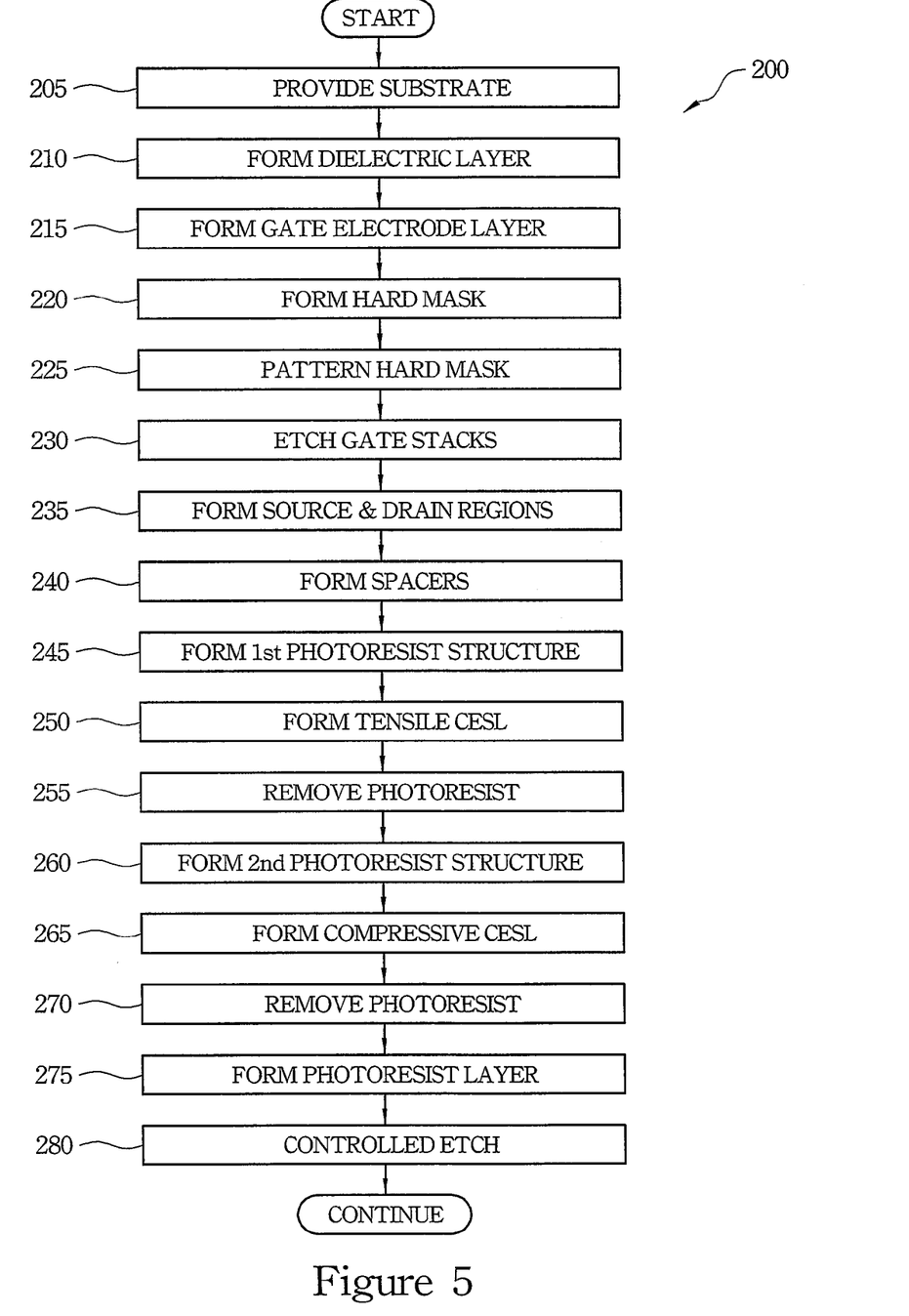
FIG. 5 is a flow diagram illustrating a method of fabricating a semiconductor device according to another embodiment of the present invention.

The fabrication of the structure of the present invention will now be described. FIG. 5 is a flow diagram illustrating a method 200 of fabricating a semiconductor device according to an embodiment of the present invention. At START it is presumed that the materials and equipment needed to perform the method are available and operational. The method 200 begins with the provision of a substrate (step 205), for example a wafer of doped silicon or another suitable semiconductor material that has been sliced from an ingot. Note that herein, the terms 'semiconductor material' and 'semiconductor substrate' are used in the broad sense of a base or platform for fabricating a semiconductor device. In this embodiment, it is assumed (though not separately shown) that the substrate has been appropriately doped for the formation of a CMOS device. A thin dielectric layer is then formed on the upper surface of the substrate (step 210). In many applications, this simply involves environmentally encouraging the formation of an oxide on the upper surface of the substrate, although other methods are used as well. A somewhat thicker gate electrode layer, for example of poly, is then formed above the dielectric layer (step 215).

In the embodiment of FIG. 5, a hard mask layer is then formed (step 220) and patterned (step 225). The remaining portions of the hard mask layer protect those portions of the gate electrode layer and the dielectric layer disposed directly beneath them so that an etching process (step 230) may be used to create a gate stacks. Note again that for purposes of illustration the method 200 will be described in terms of two gate stacks, even though in most applications a great many such structures will be formed using the same process steps. In this embodiment, one gate stack will be used to form a PMOS device, and the other to form an NMOS device. Source and drain regions are formed, appropriate to these devices (step 235). It is noted that this operation requires a number of steps, although for simplicity they are not separately shown here.

Spacers are then formed (step 240) on either side of each gate structure, for example out of a nitride layer that is deposited and etched to a desired configuration as part of this operation. In some embodiments (not shown), the source regions and the drain regions are formed in two parts, a shallow portion prior to spacer formation and a deeper portion after. In either case, in the embodiment of FIG. 5, the PMOS gate structure is then covered with a first protective photoresist structure (step 245), and a CESL is formed (step 250) over the NMOS device. The CESL is formed in such a manner as to produce a tensile stress in the channel region of the NMOS device. The first photoresist structure is then removed (step 255), and a second formed (step 260). The second photoresist structure protects both the NMOS device and the tensile CESL formed over it. The CESL is then formed (step 265) in such a manner as to produce a compressive stress in the channel region of the PMOS device. The second photoresist structure is then removed (step 270).

In the embodiment of FIG. 5, a photoresist layer is then formed (step 275) over the entire wafer, or at least over the CMOS device. A controlled etch is then performed (step 280). The etch is timed to reduce the photoresist layer, and then the CESL, until the CESL has become discontinuous. Naturally, this will occur at the top of each device. Preferably, the etch continues until none of the CESL is directly over the gate electrode; that is, until the top of the gate electrode (or the contact or other region, if any, formed on top of it) is exposed. The etch may be continued until the upper boundary of the CESL layer is below the upper boundary of the gate electrode. In any case, the etch is continued until the CESL is reduced to a level corresponding with the desired channel-stress magnitude. For example, the upper boundary of the CESL layer may be reduced to 0% to 80% of the height of the gate structure. The process then continues with additional fabrication steps until the semiconductor chip including the CMOS device is ready to be packaged for use.

Figure 6A:
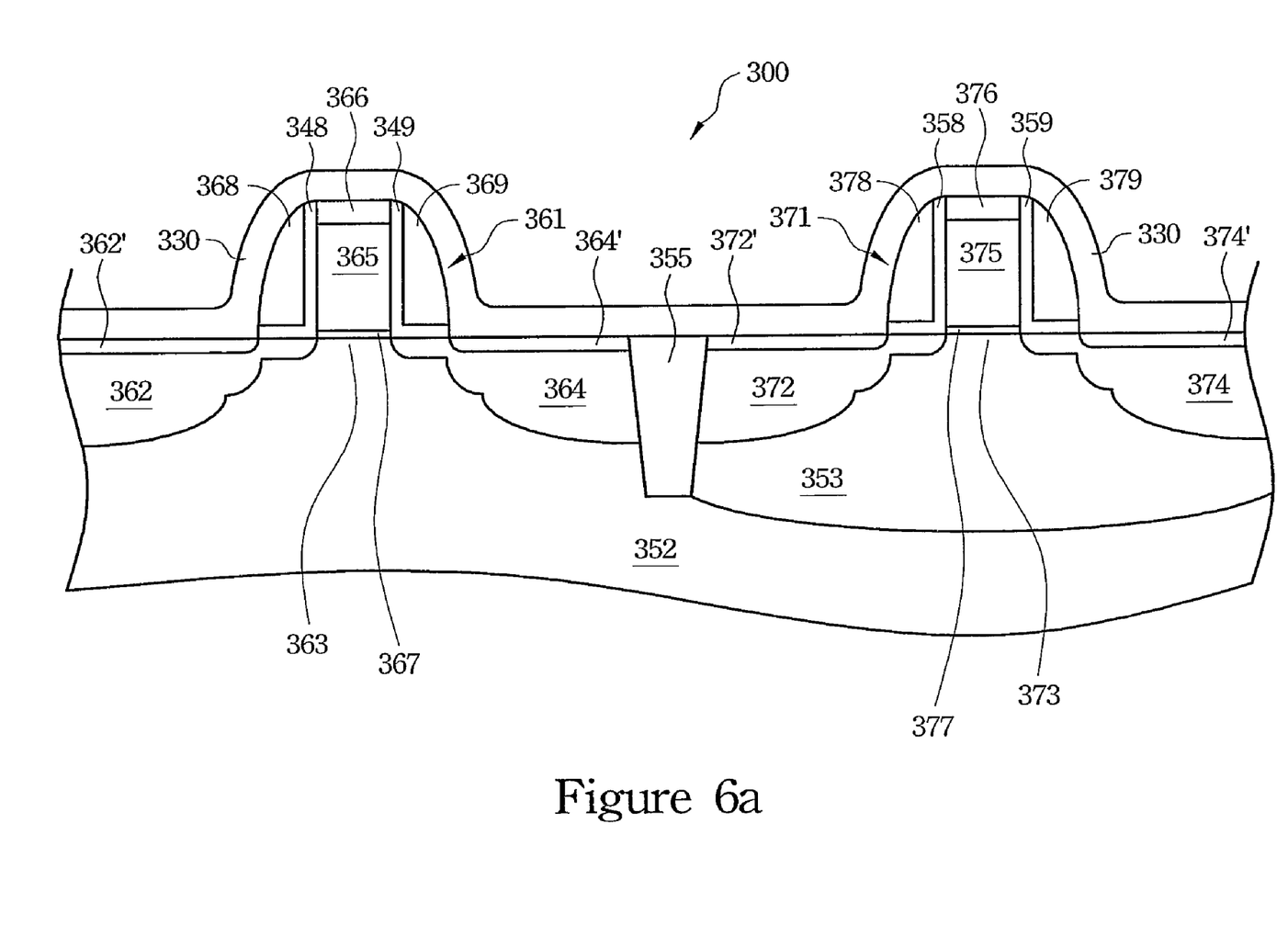
FIGS. 6a through 6g are a sequence of side views illustrating in cross-section the configuration of a semiconductor device at selected stages during the fabrication process according to another embodiment of the present invention.
Figure 6B:
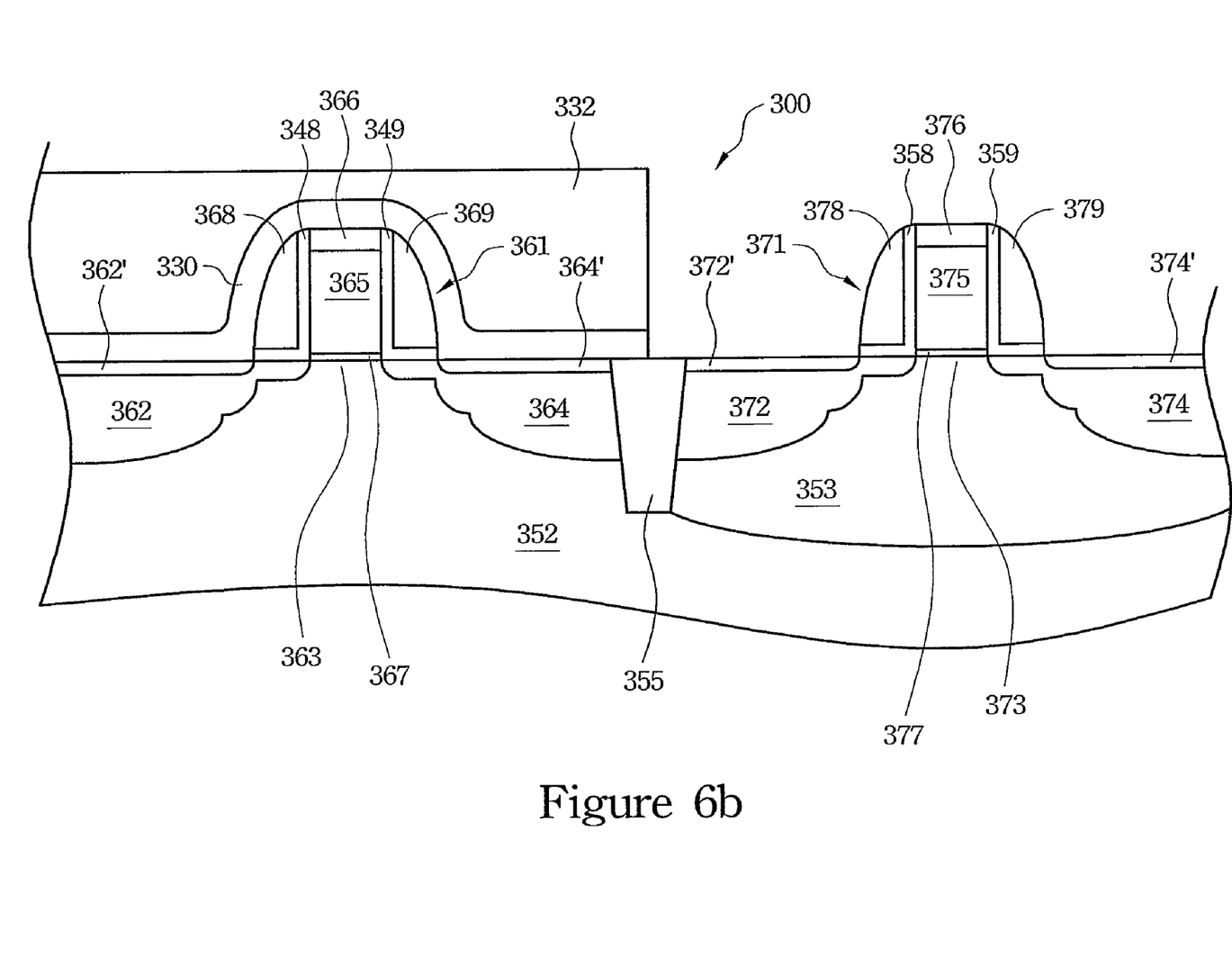

Another embodiment is shown in FIGS. 6a through 6g. FIGS. 6a through 6g are a sequence of side views illustrating in cross-section a semiconductor device 300 at selected stages during the fabrication process according to an embodiment of the present invention. It is noted that semiconductor device 300 is similar in many respects to the CMOS device 50 of FIG. 2, and to the individual transistors depicted elsewhere. Similar or identical features are therefore numbered analogously, but it is not thereby implied that a similar feature is necessarily identical. In FIG. 6a, it may be seen that semiconductor device 300 includes two gate structures, 361 and 371, formed over substrate 352. Gate structure 361 includes a gate electrode 365 that is separated from the substrate 352 by a gate dielectric layer 367 and capped with a metal contact 366. On either side of the gate electrode are spacers 368 and 369, separated from the gate electrode 365 by oxide structures 348 and 349, respectively. Likewise, gate structure 371 includes a gate electrode 375 that is separated from the substrate 352 by a gate dielectric layer 377 and capped with a metal contact 376. On either side of the gate electrode are spacers 378 and 379, which are separated from the gate electrode 375 by oxide structures 358 and 359, respectively.

Formed in substrate 552 on one side of gate structure 361 is a source region 362, which includes a silicide portion 362'; drain region 364, including silicide portion 364', is formed on the other. As substrate 352 is in this embodiment, an n-well 353 has been formed in substrate 352. Source region 372 and drain region 374, including their respective silicide regions 372' and 374', have been formed in n-well 353 on either side of gate structure 371. Source region 362 and drain region 364 define an n-channel 363. Source region 372 and drain region 374 define a p-channel 373. The n-channel portion of semiconductor device 300 and the p-channel portion are isolated from each other by an STI 355. Other such structures may isolate semiconductor device 300 from other devices as well, but these are not shown in FIGS. 6a through 6g.

Figure 6C:
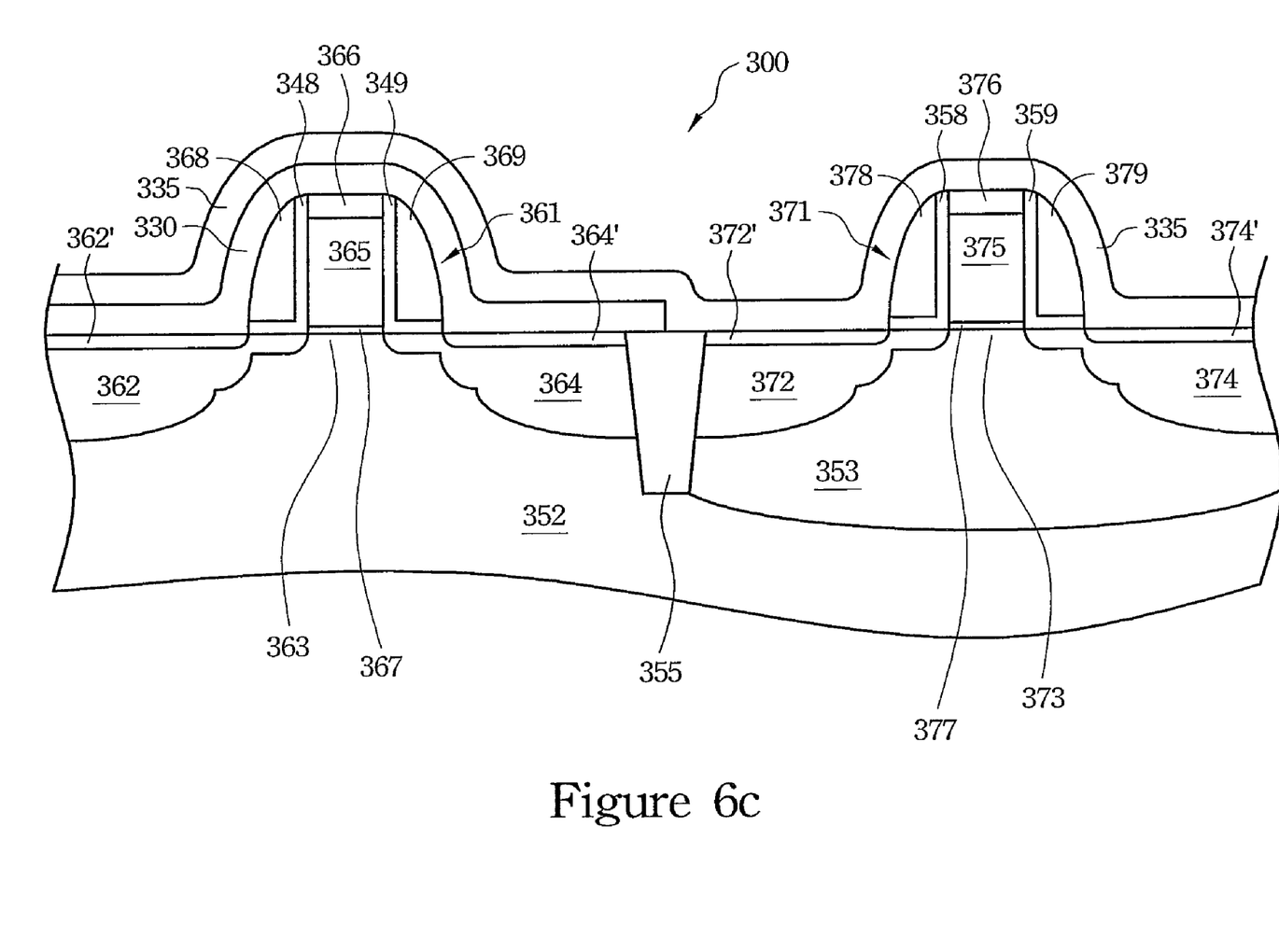
Figure 6D:
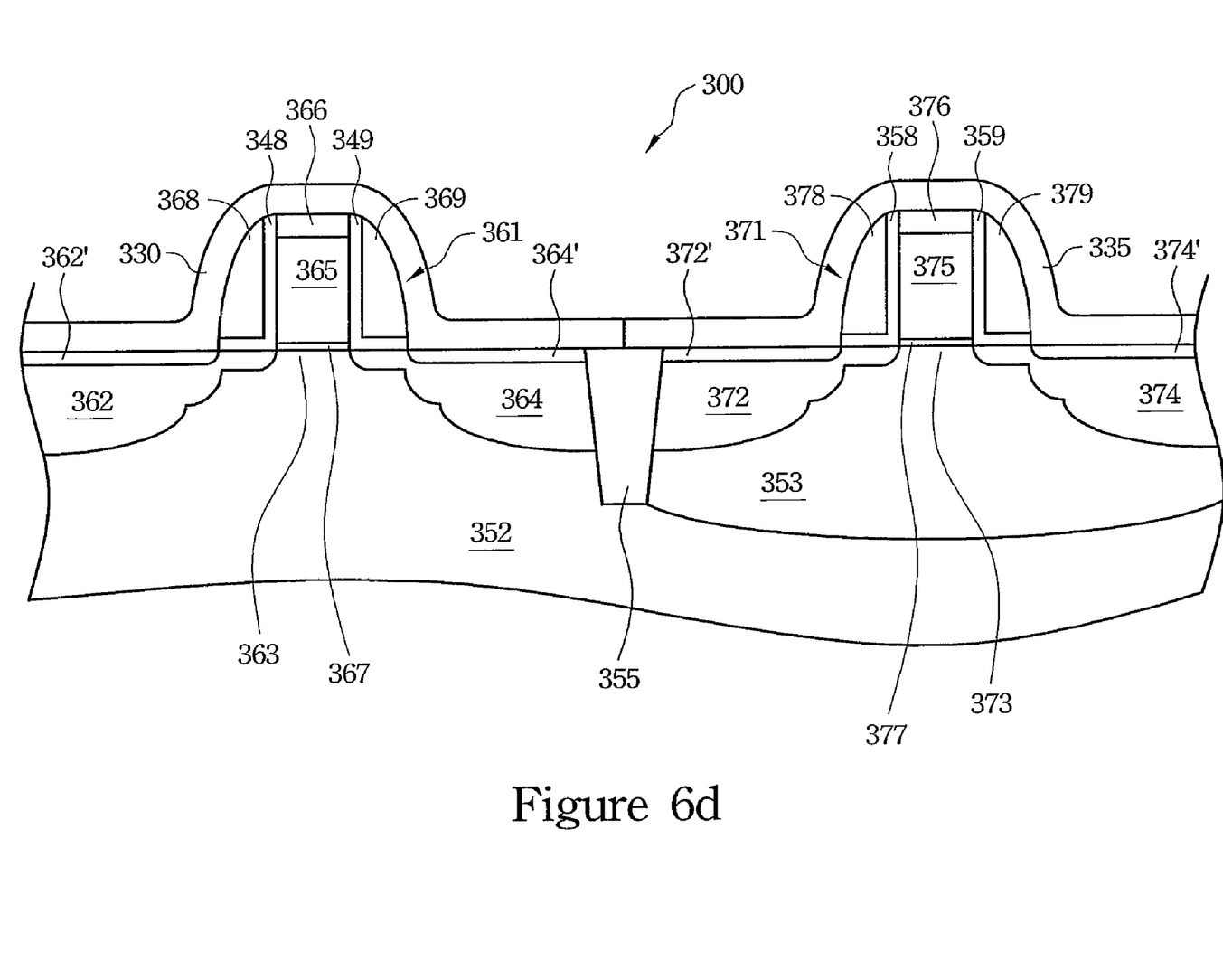
Figure 6E:
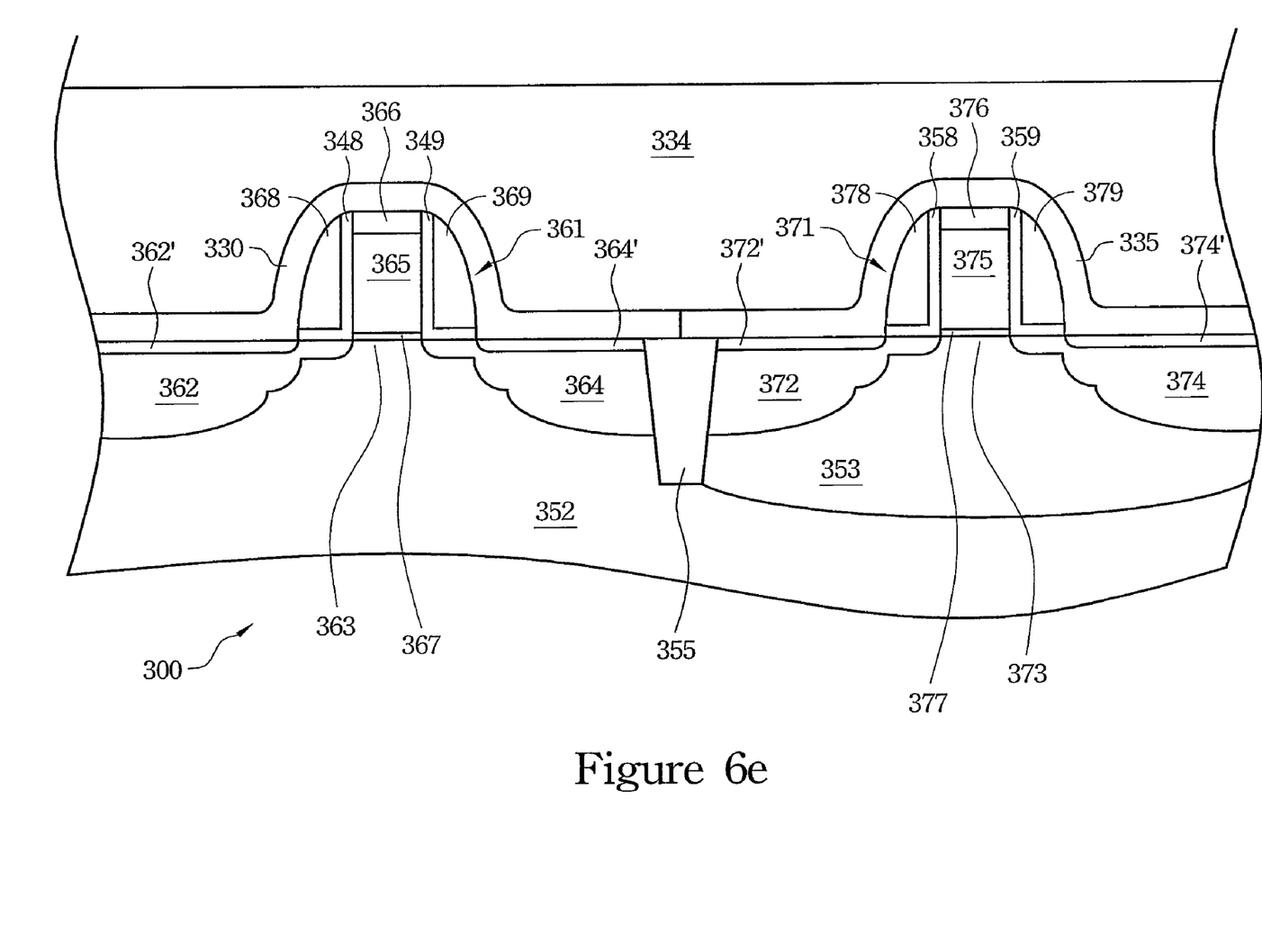

In the embodiment of FIGS. 6a through 6g, a tensile-stress producing CESL 330 has been formed over semiconductor device 300. The tensile-stress producing CESL 330 improves carrier mobility in n-channel 363, but is not useful for this purpose in respect to p-channel 373, and may be detrimental to carrier flow in that region. A protective structure 332, for example of photoresist, is for this reason formed over the n-channel portion of the semiconductor device 300, including the adjacent portion of CESL 330. The unprotected portion of CESL 330 may then be etched away, resulting in the configuration illustrated in FIG. 6b. The photoresist structure 332 is then removed, and a compressive-stress producing CESL 335 is then formed on semiconductor device 300, as shown in FIG. 6c. The compressive-stress producing CESL 335 improves carrier mobility in p-channel 373, but is not useful for this purpose in respect to n-channel 363, and may even be detrimental to carrier flow in that region. For this reason a protective structure (not shown) is used to protect the p-channel portion of semiconductor device 300, including CESL 335, so that the unprotected portion of compressive-stress producing CESL 335 may be etched away. The photoresist structure is then removed, leaving the configuration shown in FIG. 6d.

Figure 6F:
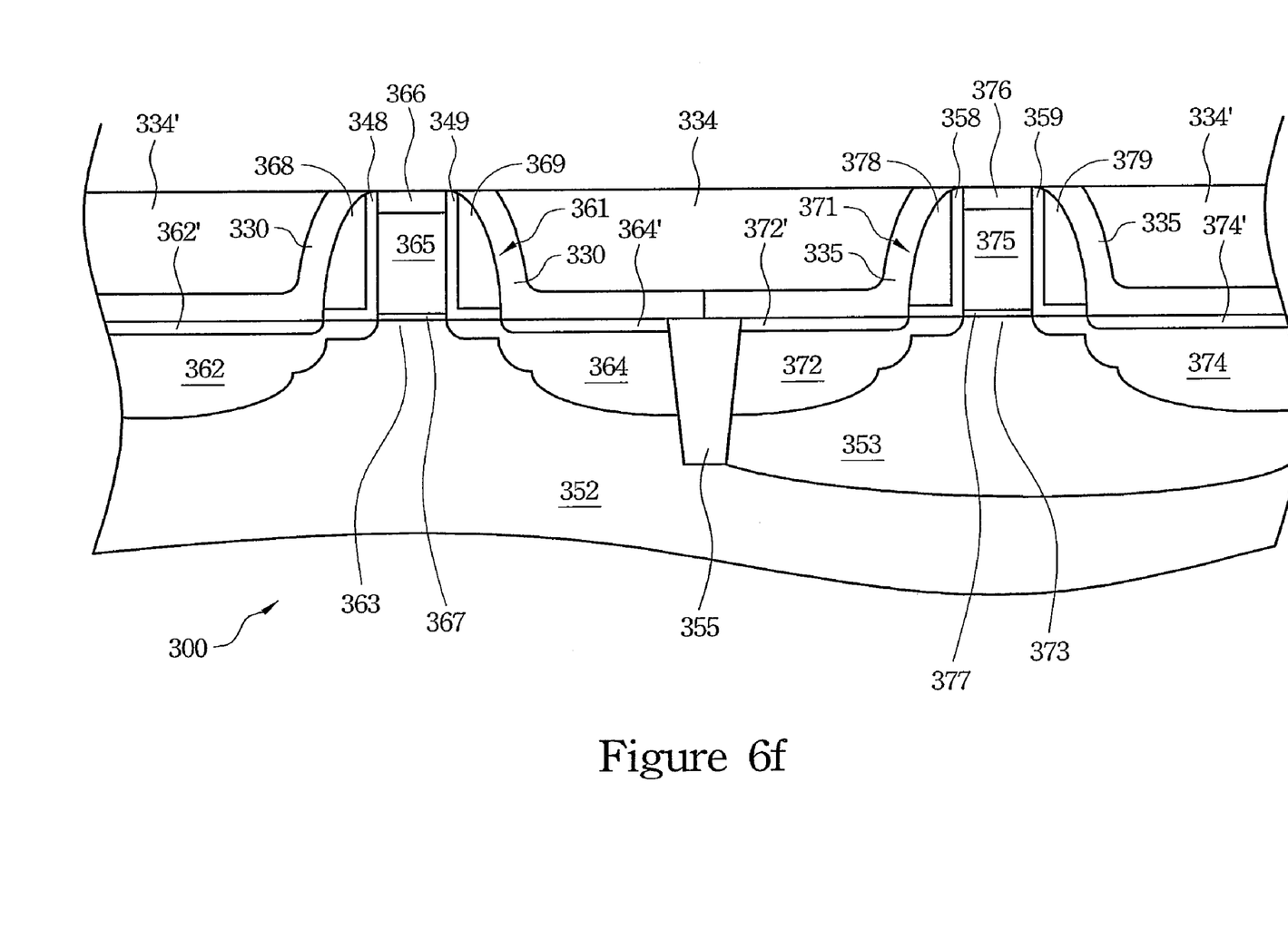
Figure 6G:
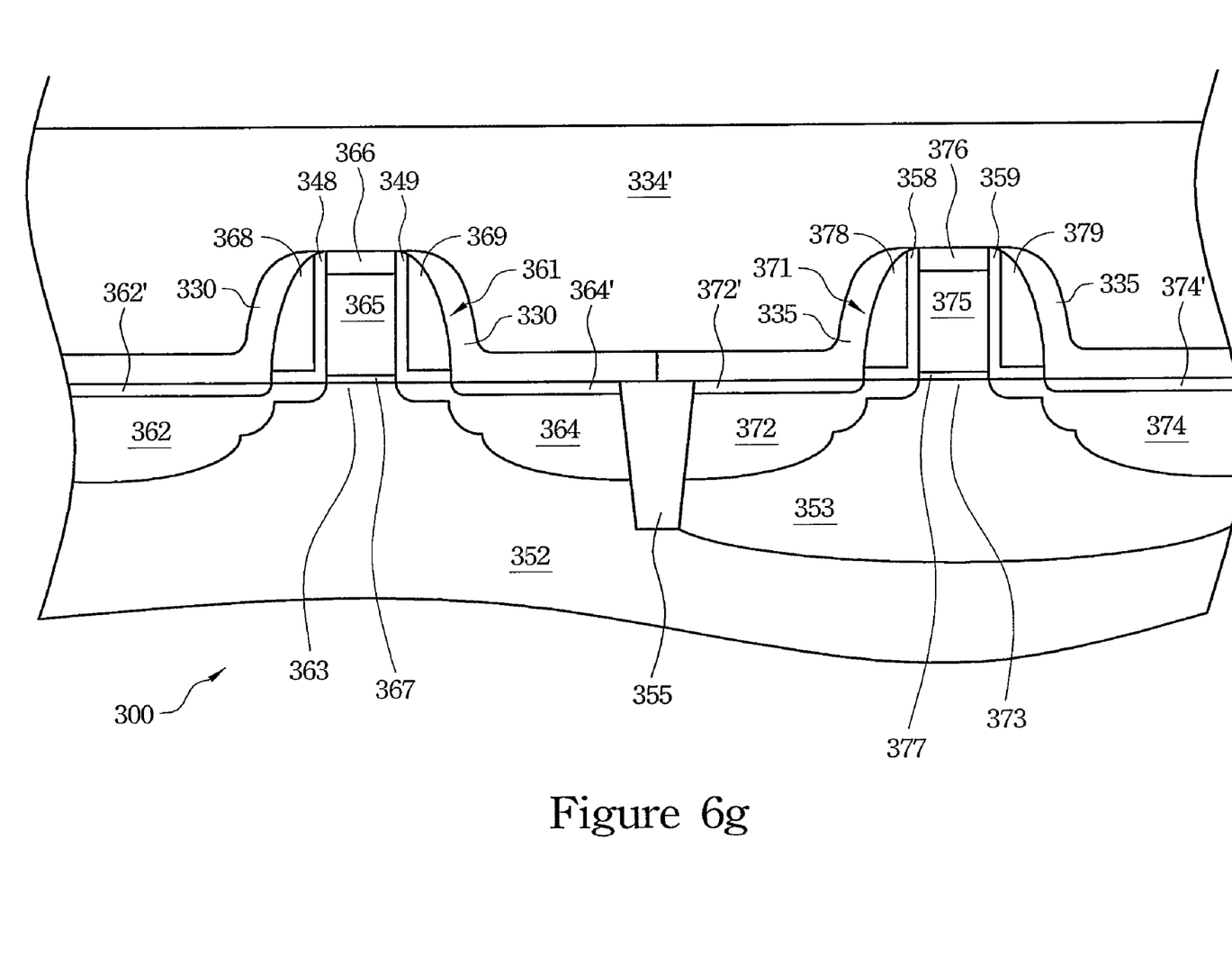

In this embodiment, an ILD (interlayer dielectric) layer 334 is then formed over the semiconductor device 300. As may be seen in FIG. 6e, the ILD layer is relatively thick, that is, it completely covers the gate structures 361 and 371 and their respective CESLs 330 and 335. The ILD layer 334 is then reduced, preferably by a CMP (chemical mechanical polishing) procedure, to a selected level. In the process, the tensile-stress producing CESL layer 330 and the compressive-stress producing CESL layer 335 are also reduced to a desired level. As previously mentioned, this procedure may be used to more-precisely control the stress forces produced by each of these CESLs, and thereby the strain induced in their respective channel regions. In this embodiment, both the CESL 330 and the compressive-stress producing CESL 335 are reduced to the level of the upper boundary of the gate structures 361 and 371, exposing the metal contacts 366 and 376, as can be seen in FIG. 6f.

The respective upper boundaries of CESL 330 and compressive-stress producing CESL 335 do not, of course, have to be reduced to the same level, though if they are to be different this process flow will be modified. For example, protective structures may be used to allow each portion of device 300 to be reduced separately, or a sacrificial portion may be added to one side to limit the effect of a CMP where it is placed. In any case, in the embodiment of FIGS. 6a through 6g, after the CESL layers have been reduced to a desirable level an additional ILD deposition is performed, creating the ILD layer 334' shown in FIG. 6g.

Although the present invention and its advantages have been described in detail, it should be understood that various changes, substitutions and alterations can be made herein without departing from the spirit and scope of the invention as defined by the appended claims. For example, the exemplary materials described above may be replaced with suitable substitutes, and the sequences of operation described may be performed in any logically-permissible order. In addition, other structures or process steps may be added to, or in some cases removed from, the structures and methods described above without departing from the spirit of the invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a gate electrode separated from a semiconductor substrate by a dielectric layer;
   a source region and a drain region formed in the substrate and defining a channel region below the gate electrode;
   spacers located adjacent to the gate electrode, wherein the spacers extend further from the substrate than the gate electrode; and
   a discontinuous stress-inducing layer formed over the source region and the drain region, the gate electrode extending further from the substrate than the discontinuous stress-inducing layer.

2. The semiconductor device of claim 1, wherein no portion of the stress-inducing layer is disposed directly over the gate electrode.

3. The semiconductor device of claim 1, wherein the stress-inducing layer completely covers the source region and the drain region.

4. The semiconductor device of claim 1, wherein the stress-inducing layer is a tensile stress inducer.

5. The semiconductor device of claim 1, wherein the stress-inducing layer is a compressive stress inducer.

6. A MOSFET, comprising:
   an NMOS transistor;
   a PMOS transistor; and
   at least one channel-stressing CESL (contact etch stop, layer) formed on one of the NMOS and PMOS transistors, wherein the at least one channel-stressing CESL layer is discontinuous and comprises a first portion and a second portion, the first portion extending along a first spacer of the one of the NMOS and PMOS transistors further from the substrate than the second portion extending alone a second spacer of the one of the NMOS and PMOS transistors.

7. The MOSFET of claim 6, wherein the at least one channel-stressing CESL layer comprises a compressive stress CESL over the PMOS transistor and a tensile stress CESL layer over the NMOS device.

8. The MOSFET of claim 7, wherein the compressive stress CESL and the tensile stress CESL are each discontinuous.

9. The MOSFET of claim 6, wherein the NMOS transistor and the PMOS transistor each comprise a partially-silicided source and a partially-silicided drain, wherein the respective partially-silicided sources and drains comprise nickel.

10. The MOSFET of claim 6, wherein the upper boundary of the at least one channel-stressing CESL is lower than the upper boundary of the gate electrode of the associated transistor by a dimension d that is between 0% and 95% of the gate electrode height.

11. The MOSFET of claim 10, wherein d is greater than 80% of the height of the gate electrode.

12. A semiconductor device, comprising at least one transistor, the transistor comprising a gate structure formed on a substrate adjacent a source region and a drain region, and overlaid by a discontinuous CESL to apply stress to the channel defined by the source region and the drain region, wherein a first portion of the CESL extends along a first spacer of the transistor from the source region a first distance and a second portion of the CESL extends along a second spacer of the transistor from the drain region a second distance different from the first distance.

13. The semiconductor device of claim 12, wherein the gate structure comprises a gate electrode, and wherein no portion of the CESL is above the upper boundary of the gate electrode.

14. The semiconductor device of claim 12, wherein the semiconductor device is a PMOS device.

15. The semiconductor device of claim 12, wherein the semiconductor device is an NMOS device.

16. The semiconductor device of claim 12, wherein the at least one transistor comprises at least an NMOS transistor and a PMOS transistor.

* * * * *

UNITED STATES PATENT AND TRADEMARK OFFICE
CERTIFICATE OF CORRECTION

PATENT NO. : 7,655,984 B2 Page 1 of 1
APPLICATION NO. : 11/811693
DATED : February 2, 2010
INVENTOR(S) : Chen et al.

It is certified that error appears in the above-identified patent and that said Letters Patent is hereby corrected as shown below:

In Col. 10, line 1, Claim 6, after stop delete ",".
In Col. 10, line 8, Claim 6, delete "alone" and insert --along--.

Signed and Sealed this

Twentieth Day of April, 2010

David J. Kappos
*Director of the United States Patent and Trademark Office*